United States Patent

Andrieu et al.

[11] Patent Number: 5,519,304
[45] Date of Patent: May 21, 1996

[54] CIRCUIT FOR MEASURING THE STATE OF CHARGE OF AN ELECTROCHEMICAL CELL

[75] Inventors: Xavier Andrieu, Bretigny Sur Orge; Philippe Poignant, Palaiseau, both of France

[73] Assignee: Alcatel Alsthom Compagnie Generale D'Electricite, Paris, France

[21] Appl. No.: 494,079

[22] Filed: Jun. 23, 1995

[30] Foreign Application Priority Data

Jun. 24, 1994 [FR] France .................................. 94 07806

[51] Int. Cl.⁶ .................................................. H02J 7/00
[52] U.S. Cl. .............................. 320/48; 320/430; 320/13; 320/39
[58] Field of Search .................... 320/48, 13, 39; 324/427, 428, 433; 340/636; 429/91–6

[56] References Cited

U.S. PATENT DOCUMENTS

| | | | |
|---|---|---|---|
| 5,119,011 | 6/1992 | Lambert | 320/43 |
| 5,416,402 | 5/1995 | Reher et al. | 320/48 |

FOREIGN PATENT DOCUMENTS

0549464A1  6/1993  European Pat. Off. .

OTHER PUBLICATIONS

*Patent Abstracts of Japan*, vol. 17, No. 626 (P–1647) 18 Nov. 1993 & JP-A-05 203 684 (Shart) Aug. 10, 1993.

*Primary Examiner*—Peter S. Wong
*Assistant Examiner*—Gregory J. Toatley, Jr.
*Attorney, Agent, or Firm*—Sughrue, Mion, Zinn, Macpeak & Seas

[57] ABSTRACT

The invention relates to a circuit for measuring the state of charge of an electrochemical cell that includes a parasitic resistance. The circuit comprises:

- means for subjecting the electrochemical cell to a reference voltage less than its nominal voltage, so as to cause it to deliver a discharge current;
- means for measuring the discharge current and providing an indication of the state of charge of the electrochemical cell; and
- correction means for correcting the reference voltage as a function of the discharge current, the correction means providing a corrected reference voltage that compensates for the parasitic resistance.

2 Claims, 3 Drawing Sheets

CIRCUIT FOR MEASURING THE STATE OF CHARGE OF AN ELECTROCHEMICAL CELL

The field of the invention is that of circuit for indicating the state of charge of an electrochemical cell, e.g. constituted by a storage cell or a battery of storage cells. The term "battery of storage cells" is used to designate an assembly comprising a plurality of storage cells connected in series.

BACKGROUND OF THE INVENTION

In conventional manner, the voltage characteristic of a storage cell as a function of its discharge capacity, e.g. expressed in Ah, does not vary significantly over a large majority of discharge characteristics, and it is therefore not possible to determine the state of charge of such a storage cell merely by measuring the voltage across its terminals.

The French patent application published under the number 2 685 780 describes, in particular, a method of measuring the state of charge of an electrochemical cell, the method being of the type that consists in applying a pulse stress to said cell and in observing its response to said stress in order to estimate its state of charge. That method consists in:

subjecting the electrochemical cell to a pulse of voltage at a value less than its nominal voltage, thereby causing it to deliver a discharge current, the value of the discharge current being such that the cell presents an unambiguous characteristic of internal impedance as a function of its state of charge; and measuring said discharge current to estimate the state of charge of the electrochemical cell.

FIG. 1 shows an embodiment of circuit implementing that method.

The function of the circuit is to measure the state of charge of a storage cell 10. A control signal Ve is applied to the inverting input of an operational amplifier 11 whose non-inverting input is connected to the positive electrode of the storage cell 10. The negative electrode of the storage cell 32 is connected to ground. The output of the operational amplifier 11 is connected firstly to the cathode of a protective diode 12 having its anode connected to ground, and secondly to the base of switch means 13, constituted in this case by a transistor. Transistor 13 has its emitter connected to ground via a shunt resistor 14 that carries a current I when the transistor 13 is saturated, and its collector is connected to the non-inverting input of the operational amplifier 11. Its emitter is also connected to a circuit 15 for processing the voltage across the terminals of the resistor 14 and co-operating with a meter 16 for indicating the state of charge of the storage cell 10.

The operation of that circuit is described with reference to FIG. 2 which comprises two waveform diagrams showing the voltage Ve and the current I as a function of time.

The control signal Ve presents a voltage Vc that is greater than the voltage of the storage cell 10 which is written Vb so long as no pulse is being generated for the purpose of estimating the state of charge of the storage cell 10. The voltage at the output from the operational amplifier 11 is thus equal to zero or is negative. The transistor 13 is blocked and no current is carried by the shunt resistor 14. This state corresponds to a rest state for the system for measuring state of charge.

At a time $t_0$ the signal Ve switches to a discharge voltage Vd. This sudden change in the control signal corresponds to a constant voltage pulse of duration T intended to enable the state of charge of the storage cell 10 to be measured. The output voltage from the amplifier 11 then switches to Vd (ignoring voltage drops), i.e. it switches to a voltage that is less than Vb. The voltage across the terminals of the storage cell 10 is then equal to Vd and considerable current passes through the shunt resistor 10. This current, written $I_0$ varies in the same way as the admittance presented by the storage cell 10.

The waveform I=f(t) of FIG. 2 shows how the current I passing through the shunt resistor 14 varies. At time $t_0$, the pulse discharge presents a peak, after which it stabilizes on a value $I_0$. The current $I_0$ may be very large, e.g. about 15 A for small capacity nickel-cadmium storage cells. By measuring the current $I_0$ using the circuit 15, it is possible to determine the state of charge of the storage cell 10 and to display it on the meter 16. The circuit 15 may determine the admittance or the impedance of the storage cell 10. The duration $\Delta T$ of the pulse is preferably sufficiently long to enable $I_0$ to be measured at an instant in time that is remote from the beginning of the pulse. Variation in the current $I_0$ at the beginning of the pulse is large so measuring $I_0$ at a point A would be less accurate than measuring it at a point B which is preferably situated at an instant immediately before time $t_0+\Delta T$ where the control signal Ve returns to Vc, thereby ending the state of charge measurement. The measurement instant corresponds to the moment at which the voltage across the terminals of the resistor 14 is measured.

Circuit of the above type has given good results for small format Ni-Cd type cells: the dynamic range of the signals is meaningful and the reproducibility thereof is satisfactory. In contrast, it turns out that applying it to same-size Ni-MH type cells or to 1.3 Ah VECS type cells is not satisfactory since their characteristics of current delivered as a function of residual capacity presents a plateau, as shown in FIG. 3.

FIG. 3 shows the characteristic 30 of current I (expressed in amps) delivered by a battery of storage cells made up of five VECS type Ni-Cd cells having a capacity of 1300 mAh, as a function of its residual capacity Cr (expressed in mAh).

It can be seen that for states of charge lying in the range 30% to 80% of nominal capacity, the characteristic 30 presents a plateau, thereby making it difficult to estimate state of charge within this range. An ideal characteristic is represented by straight line 31, and an optimum estimate of a state of charge would assume that the characteristic I=f(Cr) for the storage cell under test is as close as possible to said straight line 31. The appearance of the characteristic 30 is due to parasitic resistance present in the storage cell under test, which parasitic resistance is shown in FIG. 4.

FIG. 4 is an equivalent diagram of an electrochemical cell 10.

This equivalent diagram comprises a series connection of a voltage source U, an internal resistance Ri, which is a function of the state of charge of the electrochemical cell, and a parasitic resistance Rp. The parasitic resistance Rp gives rise to the plateau in FIG. 3 and it is due to parameters such as the structure of the cell, the nature of its electrochemical couple, or the connections between cells (for a battery of storage cells connected in series).

OBJECTS AND SUMMARY OF THE INVENTION

A particular object of the present invention is to remedy this drawback by providing circuit for measuring the state of charge of an electrochemical cell, said circuit implementing the method described above, and in which the parasitic resistance of the cell under test is compensated.

This object, and others which appear below, are achieved by a circuit for measuring the state of charge of an electrochemical cell that includes a parasitic resistance, said circuit comprising:

means for subjecting said electrochemical cell to a reference voltage lower than its nominal voltage so as to cause it to deliver a discharge current; and means for measuring said discharge current to provide an indication of the state of charge of said electrochemical cell;

the circuit also comprising correction means for correcting said reference voltage as a function of said discharge current, said correction means providing a corrected reference voltage compensating for said parasitic resistance.

In an advantageous embodiment, said correction means comprise an operational amplifier delivering said corrected reference voltage where:

$$Vs=Vd+Rp \times I_0$$

in which Vd is a voltage less than said nominal voltage of said electrochemical cell, Rp is said parasitic resistance, and $I_0$ is said discharge current.

BRIEF DESCRIPTION OF THE DRAWINGS

Other characteristics of the invention appear on reading the following description of a preferred embodiment, given by way of non-limiting illustration, and from the accompanying drawings, in which.

MORE DETAILED DESCRIPTION

FIGS. 1 to 4 are described above with reference to the state of the art.

Figures 5, 6:
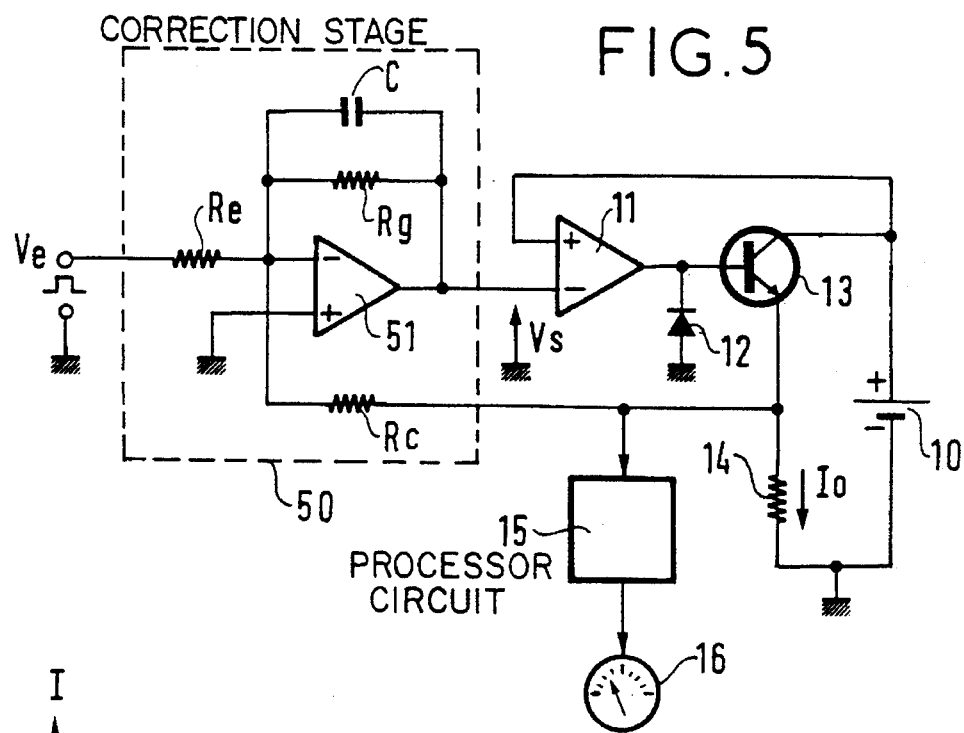
FIG. 5 shows a preferred embodiment of a circuit of the invention.
FIG. 6 shows the characteristic I=f(Cr) for a battery of five VECS type storage cells, said characteristic being measured with and then without the correction circuit of the invention.

FIG. 5 shows a preferred embodiment of the circuit of the invention. This circuit operates in the same manner as the preceding circuit, with the exception that the control signal Ve is a positive pulse and an inverter stage 50 is interposed between application of Ve and the operational amplifier 11.

Figure 1:
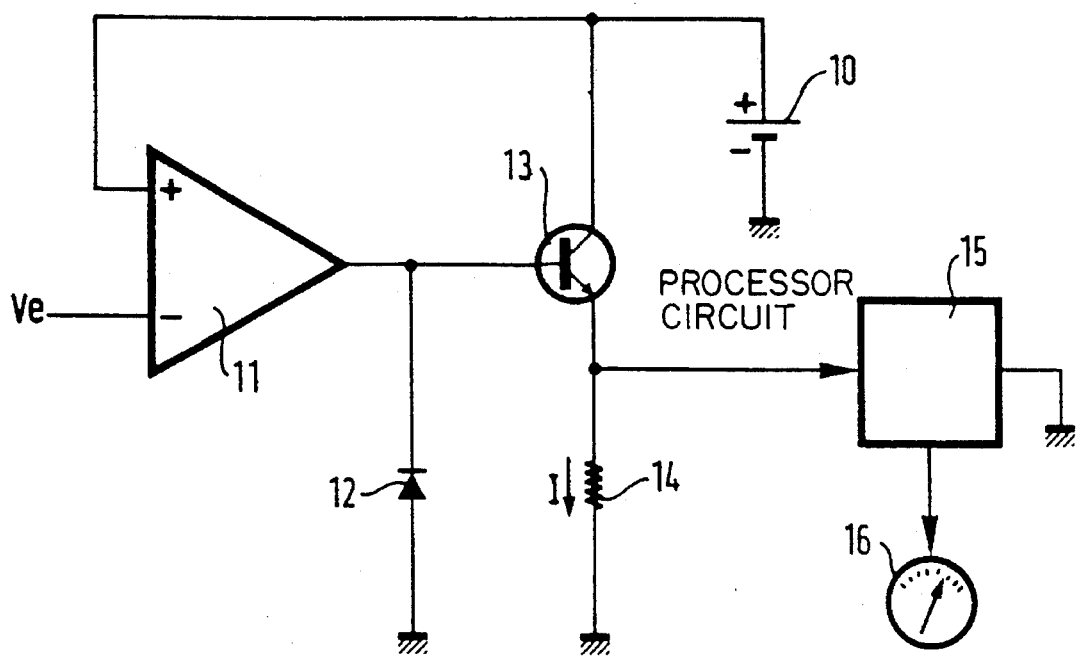
FIG. 1 shows an embodiment of a circuit for measuring the state of charge of an electrochemical cell, as described in French patent application No. 2 685 780.
Figure 2:
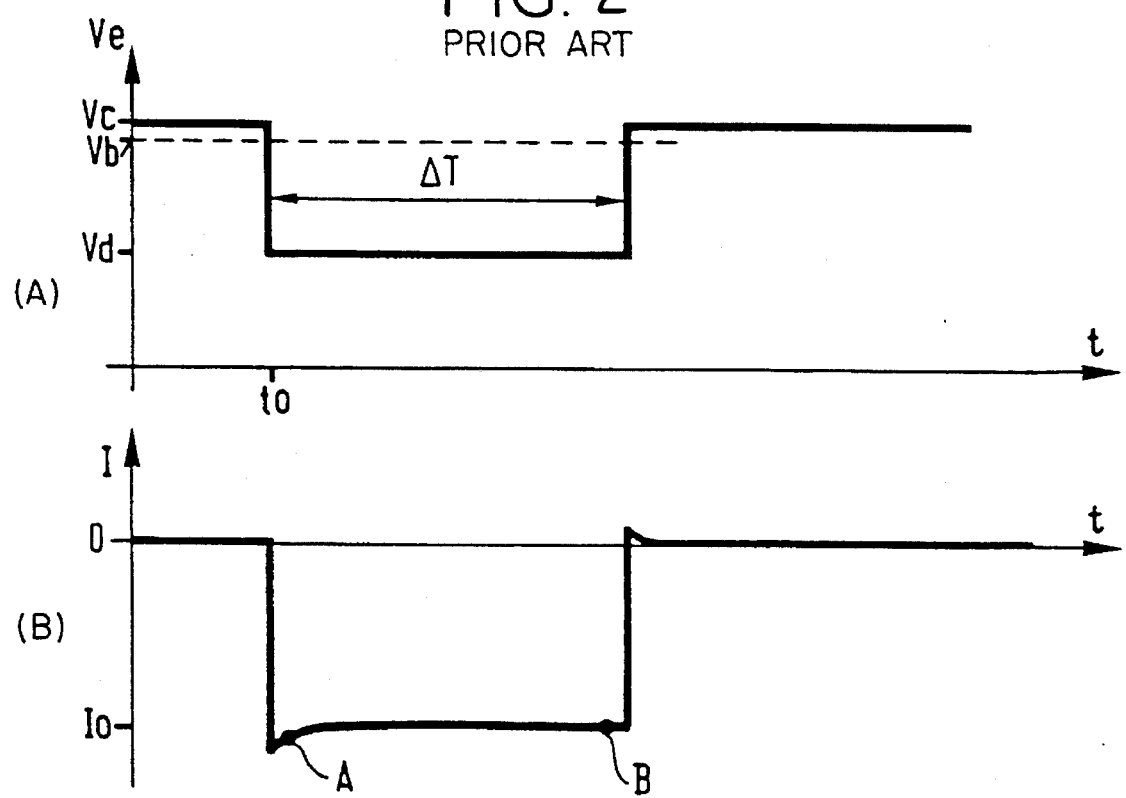
FIG. 2 is a waveform diagram relating to signals measured in the circuit of FIG. 1.

This circuit differs from that of FIG. 1 in that the means for imposing a reference voltage to the electrochemical cell 10 include correction means for correcting the parasitic resistance presented by the cell 10. These correction means are given overall reference 50 and are implemented in this case in the form of a summing and inverter circuit built around an operational amplifier 51. A resistor Rg sets the gain of the amplifier 51. The reference voltage Ve is applied to the end of an input resistor Re, and a compensation voltage equal to Rs×Io is applied to the end of a correction resistor Rc. The current $I_0$ is the discharge current from the cell 10. The resistor Rc is of high resistance to avoid disturbing measurement of the current $I_0$ by the processing circuit 15. The output voltage from the correction means 50 is equal to $Vs=-Rg(Ve/Rc+Rs \times I_0/Rc)$. This voltage is applied to the inverting input of the operational amplifier 11 and constitutes a corrected reference voltage.

The value of (Rg×Rs)/Rc corresponds to the correction of the parasitic resistance Rp which is to be compensated. Thus, the value of Rc must be equal to (Rg×Rs)/Rp, i.e. it must be inversely proportional to the parasitic resistance Rp. Normalizing, a constant voltage pulse is obtained of amplitude $Vs=Vd+Rp \times I_0$.

Since the correction applied consists in a positive reaction, care must be taken to avoid overcompensating the parasitic resistance since otherwise the circuit for measuring state of charge would become unstable. Also, because of said positive reaction, the circuit will tend to increase the constant voltage stress more and more until the input pulse disappears. This does not present a problem providing the duration AT of the pulse is short, as is the case.

Advantageously, temperature compensation is provided for the measurement circuit, said temperature compensation consisting in placing a positive temperature coefficient (PTC) type resistor in series with the correction resistor Rc, optionally in parallel with a resistor for adjusting the characteristic of said PTC resistor.

In order to eliminate the current peak that is obtained on application of the reference voltage, a capacitor C is advantageously connected in parallel with the resistor Rg so as to form an integrator.

The transistor 13 may be replaced by any other switch means, e.g. a power MOSFET transistor.

FIG. 6 shows the characteristic I=f(Cr) of a battery of five VECS type storage cells, said characteristic being measured without and then with the correction circuit of the invention. The cells were connected in series, were trademarked SAFT, and had a nominal capacity of 1.3 Ah. The correction resistor Rc had a resistance of 10 kΩ.

Figure 3:
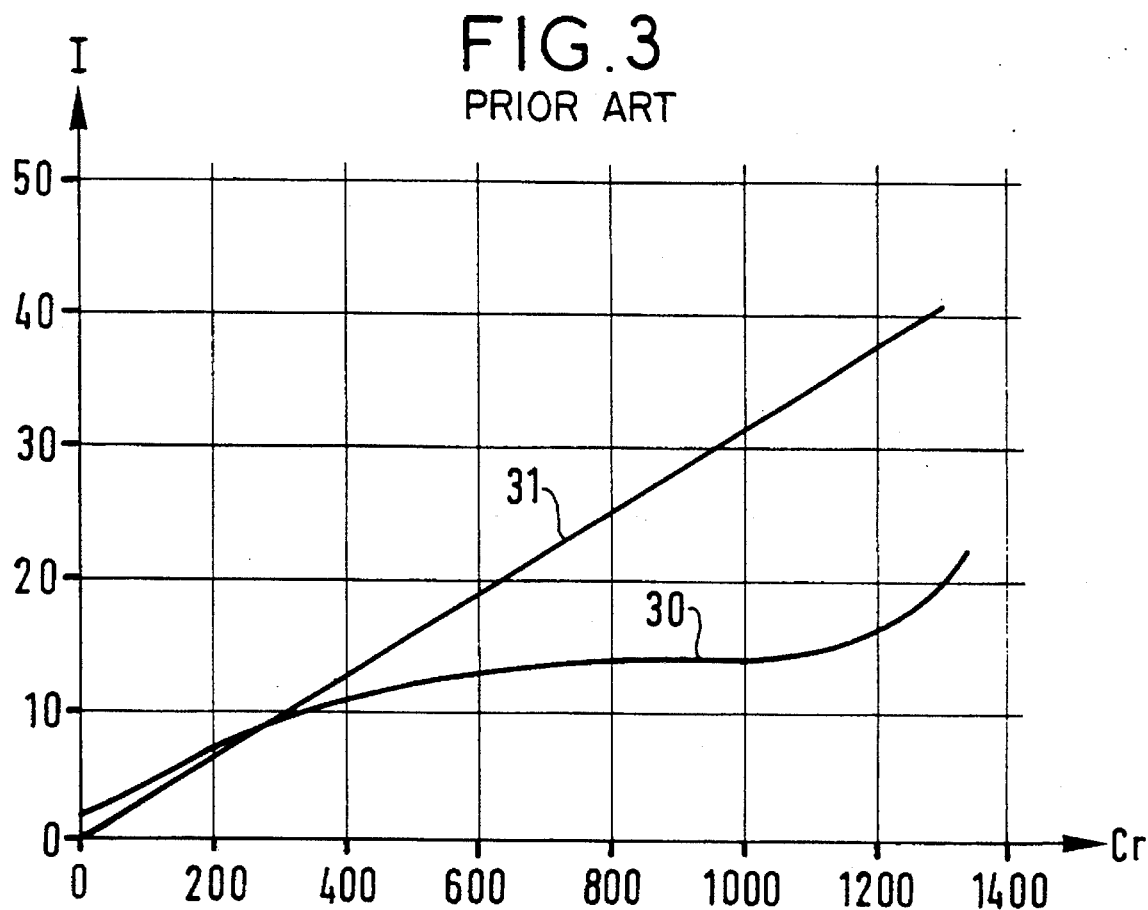
FIG. 3 shows the characteristic of current delivered by an electrochemical cell as a function of its residual capacity, said characteristic showing reduced variation of current over a large range of residual capacity.
Figure 4:
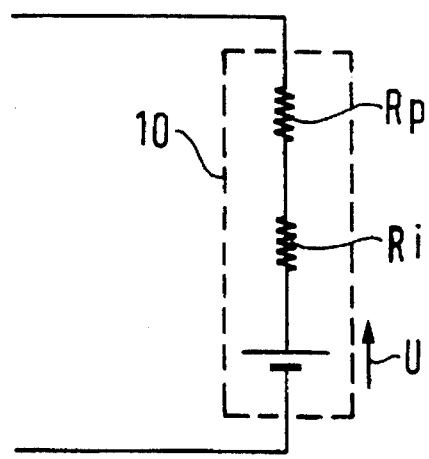
FIG. 4 is an equivalent diagram of an electrochemical cell, said equivalent diagram demonstrating a parasitic resistance.

The scales are the same as in FIG. 3, and the characteristic 60 corresponds to the characteristic 30 of FIG. 3. No correction was made. By using the circuit of the invention, characteristic 61 was obtained. This characteristic has no plateau and approximates to a straight line. This means that estimating the state of charge is greatly facilitated.

We claim:

1. A circuit for measuring the state of charge of an electrochemical cell that includes a parasitic resistance, said circuit comprising:

means for subjecting said electrochemical cell to a reference voltage lower than its nominal voltage so as to cause it to deliver a discharge current; and means for measuring said discharge current to provide an indication of the state of charge of said electrochemical cell;

the circuit being also comprising correction means for correcting said reference voltage as a function of said discharge current, said correction means providing a corrected reference voltage compensating for said parasitic resistance.

2. A circuit according to claim 1, wherein said correction means comprise an operational amplifier delivering said corrected reference voltage Vs where:

$$Vs=Vd+Rp \times I_0$$

in which Vd is a voltage less than said nominal voltage of said electrochemical cell, Rp is said parasitic resistance, and $I_0$ is said discharge current.

* * * * *